United States Patent
Wang

(10) Patent No.: US 12,016,218 B2
(45) Date of Patent: Jun. 18, 2024

(54) DISPLAY PANEL AND DISPLAY DEVICE

(71) Applicant: Wuhan China Star Optoelectronics Semiconductor Display Technology Co., Ltd., Hubei (CN)

(72) Inventor: Wenqiang Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 610 days.

(21) Appl. No.: 17/266,151

(22) PCT Filed: Nov. 23, 2020

(86) PCT No.: PCT/CN2020/130857
§ 371 (c)(1),
(2) Date: Feb. 5, 2021

(87) PCT Pub. No.: WO2022/099780
PCT Pub. Date: May 19, 2022

(65) Prior Publication Data
US 2022/0310741 A1    Sep. 29, 2022

(30) Foreign Application Priority Data
Nov. 13, 2020 (CN) .......................... 202011266801.4

(51) Int. Cl.
*H10K 59/131* (2023.01)
*H10K 59/122* (2023.01)
*H10K 59/35* (2023.01)

(52) U.S. Cl.
CPC ......... *H10K 59/131* (2023.02); *H10K 59/122* (2023.02); *H10K 59/352* (2023.02)

(58) Field of Classification Search
CPC ..... H10K 59/131; H10K 59/352; G09F 9/301
See application file for complete search history.

(56) References Cited

U.S. PATENT DOCUMENTS

| | | | | |
|---|---|---|---|---|
| 2020/0020273 | A1* | 1/2020 | Hong | ........................ G09G 3/32 |
| 2022/0039248 | A1* | 2/2022 | Sano | ...................... H05K 1/189 |

FOREIGN PATENT DOCUMENTS

| | | |
|---|---|---|
| CN | 107710885 | 2/2018 |
| CN | 110289292 | 9/2019 |

(Continued)

OTHER PUBLICATIONS

International Search Report and the Written Opinion dated Jul. 26, 2021 From the International Searching Authority Re. Application No. PCT/CN2020/130857 and Its Translation Into English. (17 Pages).

(Continued)

*Primary Examiner* — Michele Fan

(57) ABSTRACT

A display panel and a display device are provided. The display panel includes a unit island, a connecting part, a light emitting unit, and a signal line. The connecting part is connected to each side of the unit island, and each connecting part includes a bending part disposed in at least three bending directions and at least one straight part. The display panel is easier to be deformed and has a better deformation effect. Moreover, the components of the display panel will not interfere with each other, which effectively enhance the expansion performance and reliability of the panel.

15 Claims, 7 Drawing Sheets

(56) References Cited

FOREIGN PATENT DOCUMENTS

| | | |
|---|---|---|
| CN | 110718555 | 1/2020 |
| CN | 111276528 | 6/2020 |
| CN | 111326068 | 6/2020 |
| CN | 111383531 | 7/2020 |
| KR | 10-2016-0098636 | 8/2016 |

OTHER PUBLICATIONS

Notification of Office Action and Search Report dated Mar. 24, 2023 From the State Intellectual Property Office of the People's Republic of China Re. Application No. 202011266801.4 and Its Translaton Into English. (14 Pages).

* cited by examiner

DISPLAY PANEL AND DISPLAY DEVICE

RELATED APPLICATIONS

This application is a National Phase of PCT Patent Application No. PCT/CN2020/130857 having International filing date of Nov. 23, 2020, which claims the benefit of priority of Chinese Patent Application No. 202011266801.4 filed on Nov. 13, 2020. The contents of the above applications are all incorporated by reference as if fully set forth herein in their entirety.

FIELD AND BACKGROUND OF THE INVENTION

The present disclosure relates to the technical field of display, and particularly, to a display panel and a display device.

In recent years, with the continuous development of display technology, flexible display screens have been used in various fields because they can adapt to different environments.

The flexible display panel has bendable or foldable characteristics. Among the flexible display panels, compared to other types of flexible display panels, such as foldable and rollable display screens, retractable, flexible displays have advantages, such as lighter and thinner properties, lower power consumption, and adjustable mechanical properties, and also achieve a good display effect when stretched in any direction. Therefore, more and more people value the retractable flexible display panels. However, conventional retractable flexible display screens still have many technical problems and structural defects. A current design problem of the retractable flexible display is mainly due to mutual interference between the display integrated unit structure and the voltage transmission line structure when the module reaches a certain display pixel density; and the unsatisfactory mechanical characteristics of the overall module. Under the stretched or compressed condition, a display device layer and a voltage transmission layer in the display screen are prone to permanent fractures, and the flexible display panel has an unsatisfactory number of times that it can be retracted.

Therefore, it is necessary to propose solutions to the problems in the prior art.

SUMMARY OF THE INVENTION

Technical Problems

Based on the above, the conventional retractable flexible display panel has the following problems which are unfavorable to enhance the integrated performance of retractable flexible display panel. The problems include the mutual interference between the display integrated unit structure and the voltage transmission line structure when the module reaches a certain display pixel density; and the unsatisfactory mechanical characteristics of the overall module. Under the stretched or compressed condition, a display device layer and a voltage transmission layer in the display screen are prone to permanent fractures, and the flexible display panel has unsatisfactory retractable number of times.

Technical Solutions

To solve the problems mentioned above, the embodiments of the present disclosure provide a display panel and a display device to solve the problem of mutual interference between the display integrated unit and the voltage transmission unit in the display panel when the conventional flexible display panel is bent, folded, stretched or compressed, and the problems of permanent fracture, less retractable number of times, unsatisfactory retractable effects caused by a circuit layer or a device layer of the flexible panel, thereby enhancing the integrated performance of the flexible display panel.

The embodiments of the present disclosure provide a display panel and a display device to improve the quality and overall performance of the retractable flexible display panel.

To solve the problems mentioned above, technical solutions provided by the present disclosure are as follows:

A first aspect of the embodiment of the present disclosure provides a display panel. The display panel comprises:
  a substrate;
  a plurality of unit islands, wherein the unit islands are arranged in an array in a first direction and a second direction of the substrate, and each of the unit islands is separated from each other;
  a plurality of connecting parts, wherein the connecting parts connect the two adjacent unit islands with each other;
  a light emitting unit, wherein the light emitting unit is disposed on the unit island, and the light emitting unit further comprises a plurality of light emitting sub-pixels; and
  a signal line, wherein the signal line is disposed on the connecting part and electrically connected to the light emitting unit.

Each of the connecting parts is connected to each side of corresponding unit island, a starting end of the connecting part is disposed at a center position of the each side of the unit island, and each of the connecting parts comprises a bending part disposed in at least three bending directions and at least one straight part.

The display panel further comprises a hollow area between the unit island and the connecting part.

According to one embodiment of the present disclosure, the bending part comprises a first bending part, a second bending part, and a third bending part. The first bending part is connected to the side of the unit island, the second bending part is connected to one end of the first bending part, one end of the straight part is connected to one end of the second bending part, and the other end of the straight part is connected to one end of the third bending part.

According to one embodiment of the present disclosure, the connecting part comprises a first connecting part and a second connecting part. The first connecting part and the second connecting part are respectively disposed on two adjacent sides of the unit island, and a distance between the third bending part of the first connecting part and the second bending part of the second connecting part is less than a distance between the straight part of the first connecting part and the first bending part or the second bending part of the first connecting part.

According to one embodiment of the present disclosure, an angle formed between a distance from a center of the circle corresponding to an arc of an inner edge of the first bending part to a foot of perpendicular of the center of the circle on the side corresponding to the first bending part and a distance from the center of the circle to a midpoint of the arc is less than 90°.

According to one embodiment of the present disclosure, a radius of an arc corresponding to an inner edge of the first bending part is greater than a radius of an arc corresponding to an inner edge of the second bending part.

According to one embodiment of the present disclosure, the two adjacent unit islands are connected to each other by the third bending part According to one embodiment of the present disclosure, the connecting part further comprises a transition part. One end of the transition part is connected to the side of the unit island, and the other end of the transition part is connected to one end of the first bending part. One end of the transition part and the side of the unit island are provided with rounded corners.

According to one embodiment of the present disclosure, the connecting parts on the two opposite sides of the unit island are disposed symmetrically corresponding to a geometric center of the unit island.

A second aspect of the embodiment of the present disclosure provides a display panel. The display panel comprises:
  a substrate;
  a plurality of unit islands, wherein the unit islands are arranged in an array in a first direction and a second direction of the substrate, and each of the unit islands is separated from each other;
  a plurality of connecting parts, wherein the connecting parts connect the two adjacent unit islands with each other;
  a light emitting unit, wherein the light emitting unit is disposed on the unit island; and
  a signal line, wherein the signal line is disposed on the connecting part and electrically connected to the light emitting unit.

Each of the connecting parts is connected to each side of corresponding unit island. A starting end of the connecting part is disposed at a center position of the each side of the unit island, and each of the connecting parts comprises a bending part disposed in at least three bending directions and at least one straight part.

According to one embodiment of the present disclosure, the bending part comprises a first bending part, a second bending part, and a third bending part. The first bending part is connected to the side of the unit island, and the second bending part is connected to one end of the first bending part. One end of the straight part is connected to one end of the second bending part, and the other end of the straight part is connected to one end of the third bending part.

According to one embodiment of the present disclosure, the connecting part comprises a first connecting part and a second connecting part. The first connecting part and the second connecting part are respectively disposed on two adjacent sides of the unit island. A distance between the third bending part of the first connecting part and the second bending part of the second connecting part is less than a distance between the straight part of the first connecting part and the first bending part or the second bending part of the first connecting part.

According to one embodiment of the present disclosure, an angle formed between a distance from a center of the circle corresponding to an arc of an inner edge of the first bending part to a foot of perpendicular of the center of the circle on the side corresponding to the first bending part and a distance from the center of the circle to a midpoint of the arc is less than 90°.

According to one embodiment of the present disclosure, a radius of an arc corresponding to an inner edge of the first bending part is greater than a radius of an arc corresponding to an inner edge of the second bending part.

According to one embodiment of the present disclosure, the two adjacent unit islands are connected to each other by the third bending part.

According to one embodiment of the present disclosure, the display panel further comprises a hollow area between the unit island and the connecting part, and the hollow area is filled with an elastic organic layer.

According to one embodiment of the present disclosure, the connecting part further comprises a transition part. One end of the transition part is connected to the side of the unit island, the other end of the transition part is connected to one end of the first bending part, and one end of the transition part and the side of the unit island are provided with rounded corners.

According to one embodiment of the present disclosure, the connecting parts on the two opposite sides of the unit island are disposed symmetrically corresponding to a geometric center of the unit island.

According to one embodiment of the present disclosure, a width of the bending part of the connecting part is the same as a width of the straight part of the connecting part.

According to one embodiment of the present disclosure, the light emitting unit comprises a plurality of light emitting sub-pixels, the light emitting sub-pixels comprises a red sub-pixel, a blue sub-pixel, and a green sub-pixel. An area of a light emitting region corresponding to the blue sub-pixel is larger than an area of a light emitting region corresponding to the red sub-pixel. The area of the light emitting region corresponding to the blue sub-pixel is larger than an area of a light emitting region corresponding to the green sub-pixel, and an arrangement shape of the blue sub-pixel, the red sub-pixel, and the green sub-pixel is the same as an arrangement shape of each of the unit islands.

A third aspect of the present disclosure provides a display device. The display device comprises a display panel. The display panel comprises:
  a substrate;
  a plurality of unit islands, wherein the unit islands are arranged in an array in a first direction and a second direction of the substrate, and each of the unit islands is separated from each other;
  a plurality of connecting parts, wherein the connecting parts connect the two adjacent unit islands with each other;
  a light emitting unit, wherein the light emitting unit is disposed on the unit island; and
  a signal line, wherein the signal line is disposed on the connecting part and electrically connected to the light emitting unit.

Each of the connecting parts is connected to each side of corresponding unit island, a starting end of the connecting part is disposed at a center position of the each side of the unit island, and each of the connecting parts comprises a bending part disposed in at least three bending directions and at least one straight part.

Beneficial Effects

Based on the above, the beneficial effects of the embodiments of the present disclosure are:

The embodiments of the present disclosure provide a display panel and a display device. The unit islands arranged in an array are disposed on the substrate of the display panel, corresponding connecting parts are arranged on each side of the unit islands, and a hollow area is existed between the connecting parts and the unit islands. The connecting parts provided by the embodiment of the present disclosure comprises a plurality of bending parts and at least one straight part. Since the connecting part is provided with the plurality of bending parts, when the flexible display panel is stretched or compressed, the bending parts are easier to be stretched, so that the display panel is more prone to deformation and the deformation effect is good. Moreover, no mutual interference of the signal lines appear between the unit islands and the connection parts, which effectively enhance the scalability performance of the retractable flexible display panel and enhance the quality and reliability of the flexible display panel.

DESCRIPTION OF SPECIFIC EMBODIMENTS OF THE INVENTION

The description of the following embodiments refers to the attached drawings to illustrate specific embodiments that can be implemented in the present disclosure.

A display panel provided by the embodiment of the present disclosure is a retractable flexible display panel. When the retractable flexible display panel is stretched or compressed by an external force, a display device layer and a circuit device layer inside the module will not be fractured or become inactive. In addition, the flexible display panel provided by the embodiments of the present disclosure has good mechanical properties, a high number of retractable number of times, and also has a good display effect.

Figure 1:
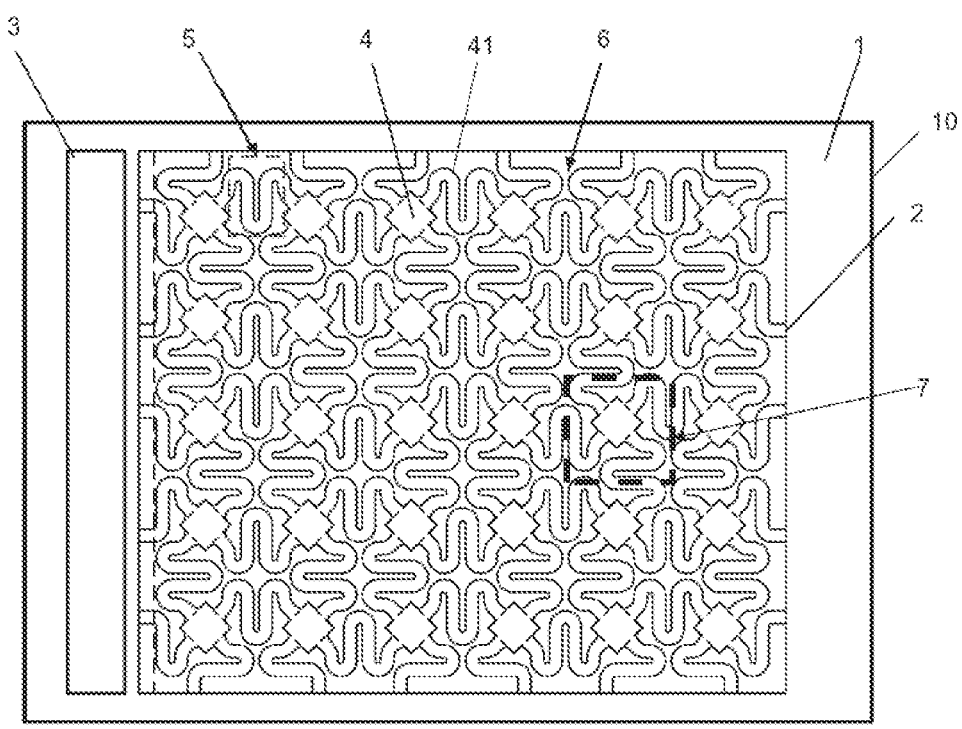
FIG. 1 is a schematic structural view of a planar structure of a flexible display panel provided by one embodiment of the present disclosure.

As shown in FIG. 1, FIG. 1 is a schematic structural view of a planar structure of a flexible display panel provided by one embodiment of the present disclosure. The flexible display panel 10 comprises a substrate 1 and a wiring area 3 disposed on the substrate 1. The wiring area 3 of the flexible display panel 10 may be arranged on one side of the substrate 1 to reduce the influence of the wiring area 3 on the display quality. In one embodiment, the wiring areas 3 of the flexible display panel 10 may be disposed at positions near the edges on both sides of the substrate 1 to reduce the influence of the wiring areas 3 on the display quality.

Moreover, the flexible display panel 10 also comprises a central display area 2. A light emitting unit and a pixel unit are arranged in the central display area 2. Specifically, in one embodiment of the present disclosure, the light emitting unit in the central display area 2 is designed to enhance scalability and display quality of the flexible display panel 10.

Preferably, the central display area 2 further comprises a unit island 4 and a connecting part 41. A plurality of unit islands 4 are arranged in an array in the central display area 2 of the display panel. The unit islands 4 may be display light emitting units on the display panel, and each of the display light emitting units corresponds to a unit island 4. Specifically, the unit islands 4 may be arranged in an array in a first direction and a second direction of the substrate 1. The first direction and the second direction may be perpendicular to each other or form a certain angle. Preferably, the first direction is the same as a width direction of the substrate 1, and the second direction is the same as a length direction of the substrate 1.

When the unit islands 4 are arranged, each of the unit islands 4 is separated from each other. That is, the two adjacent unit islands 4 are not connected to each other but are connected by the connecting part 41. A hollow area 6 is existed between the connecting part 41 and the unit island 4. In one embodiment, the hollow area 6 is filled with an elastic organic layer and penetrates an entire display function layer.

When the connecting part 41 is disposed, the connecting part 41 is correspondingly disposed at a side position of each unit island 4. In one embodiment of the present disclosure, the unit island 4 is illustrated by taking a square as an example, and the square is disposed by 45° to the horizontal direction. The unit island 4 may also have other shapes such as a diamond, a rectangle, an ellipse, etc., and the principle thereof is the same as the principle in the present disclosure. Moreover, when the unit island 4 is disposed, distances between two adjacent unit islands 4 are the same in the first direction and the second direction.

Starting ends of the connecting parts 41 are disposed on four different sides of the unit island 4. Moreover, the connecting part 41 of each unit island 4 is correspondingly connected to the connecting part 41 of the adjacent unit island 4 around it, as shown in a common connecting area 5 in FIG. 1. The adjacent connecting parts 41 are connected by the common connecting area 5 to form a whole. A plurality of display units 7, each display unit 7 comprises a unit island 4, a connecting part 41 connected to the side of the unit island 4, and the hollow area 6 between the unit island 4 and the connecting part 41. The display units 7 are arrayed in an array to constitute the flexible display panel 10 in one embodiment of the present disclosure.

In one embodiment of the present disclosure, the unit islands 4 are connected by the connecting part 41. When the flexible display panel is stretched or compressed under an action of an external force, the connecting part 41 will also deform due to the action of the external force. Under a certain degree of stretched force, the connecting part 41 is deformed, so that the flexible display panel 10 may bear relatively large deformation, and finally the scalability performance of the flexible display panel 10 may be enhanced.

Further, the connecting part 41 provided by one embodiment of the present disclosure comprises bending parts in at least three bending directions and at least one straight part.

Figure 2:
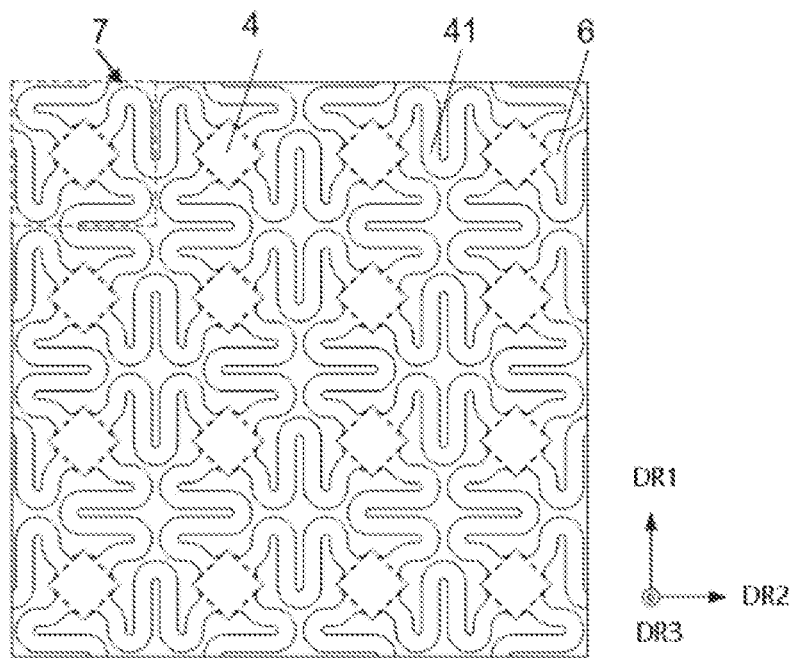
FIG. 2 is a schematic structural view of a partial structure of a flexible display panel provided by one embodiment of the present disclosure.

As shown in FIG. 2, FIG. 2 is a schematic structural view of a partial structure of a flexible display panel provided by one embodiment of the present disclosure. The partial structure is mainly a schematic structural view of the structure in the central display area of the display panel. In one embodiment of the present disclosure, the first direction is DR1, the second direction is DR2, and the direction perpendicular to the plane of the display panel is DR3.

Specifically, the flexible display panel comprises a plurality of unit islands 4 separated from each other and connecting parts 41 connected to the unit islands 4. Further, a hollow area 6 is also provided between the connecting part 41 and the unit island 4. When the display panel is stretched or compressed under an action of force, the connecting part 41 is deformed, thereby causing deformation of an entire display panel.

Moreover, for two adjacent connecting parts 41, the connecting part forms a "U"-shaped structure, and an opening of the "U"-shaped structure may be oriented in a horizontal direction or a vertical direction to adapt to deformation in different directions. When being stretched, the opening of the "U"-shaped structure formed by the connecting part 41 will be expanded, thereby achieving the scalability of the display panel. Furthermore, since bending angles are provided on both sides of the structure, it further reduces the problem of stress concentration when the flexible panel is deformed and effectively reduces the internal stress problem of the flexible panel and avoids fracture between the film layers.

Figure 3:
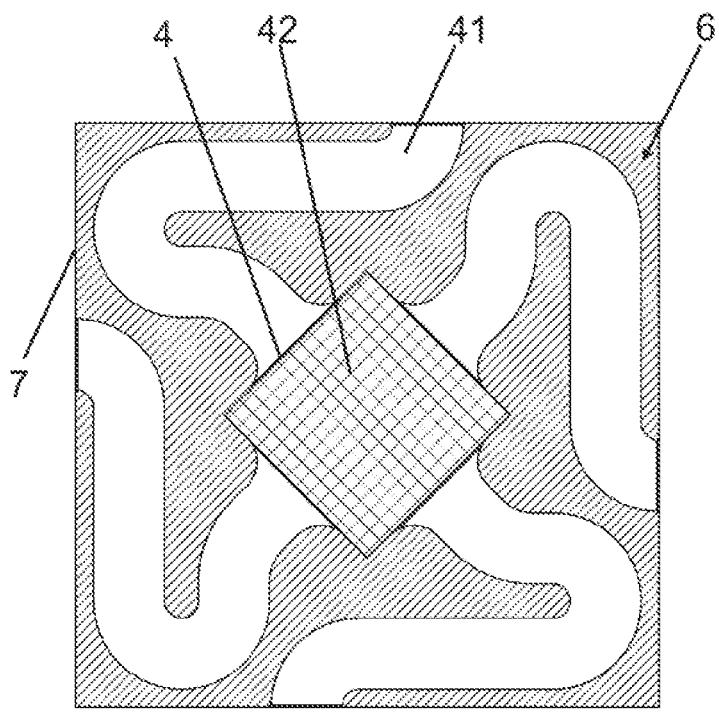
FIG. 3 is a schematic structural view of a structure of a display unit provided by one embodiment of the present disclosure.

As shown in FIG. 3, FIG. 3 is a schematic structural view of a structure of a display unit provided by one embodiment of the present disclosure. The display unit 7 comprises a unit island 4 and a connection part 41. The connecting parts 41 are respectively disposed on the four side positions of the unit island 4. Preferably, when the connecting part 41 corresponding to each side is disposed, the connecting part 41 may be disposed at a center of each side and distributed symmetrically to both sides along the center point, thereby ensuring the consistency of each display unit 7.

In one embodiment of the present disclosure, the display panel further comprises a light emitting unit 42 disposed on the unit island 4. The light emitting unit 42 emits light to form a display screen of the display panel. The light emitting unit 42 may comprise a plurality of light emitting sub-pixels, preferably comprising a red sub-pixel, a blue sub-pixel, and a green sub-pixel. When each sub-pixel is arranged, it may be disposed according to actual requirements, so as to ensure that the flexible display panel has a good effect of light emitting display.

Further, in one embodiment of the present disclosure, hollow areas 6 are provided between the adjacent connecting part 41 as well as between the connecting part 41 and the unit island 4. When each component is subjected to force, the connecting parts 41 and the unit island 4 are deformed and then deforms in the hollow area 6 to achieve the scalability of the flexible display panel.

Figure 4:
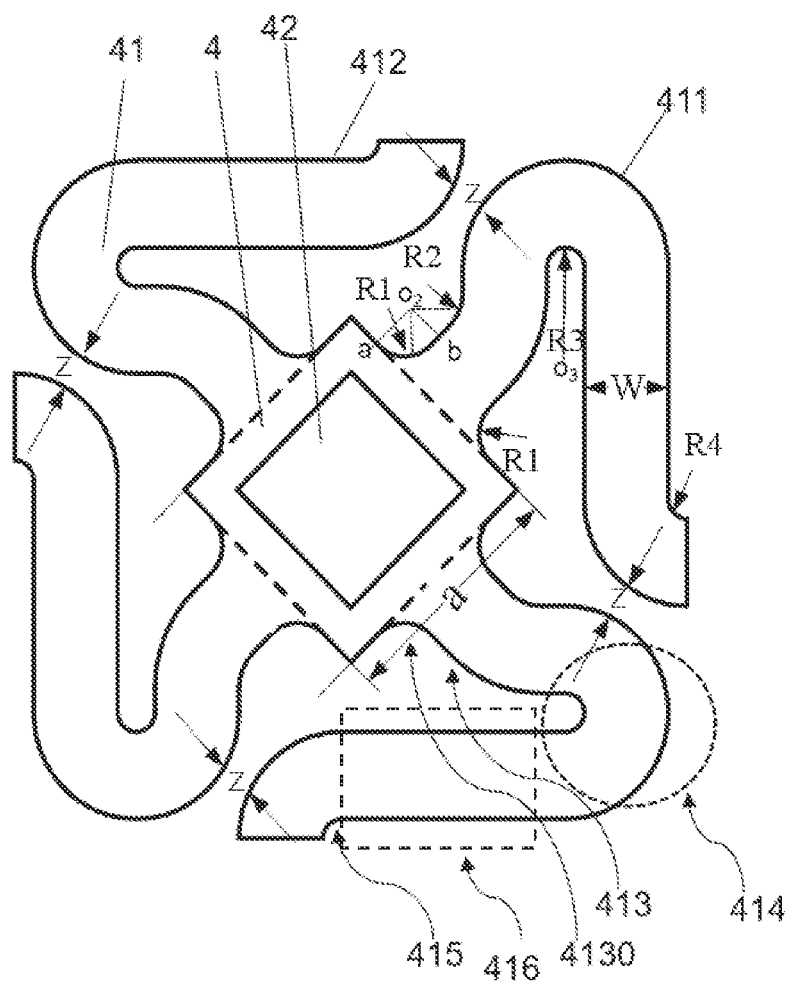
FIG. 4 is a schematic structural view of the structure of the display unit provided by one embodiment of the present disclosure.

As shown in FIG. 4, FIG. 4 is a schematic structural view of the structure of the display unit provided by one embodiment of the present disclosure. The display unit comprises a unit island 4, a light emitting unit 42 and a connecting part 41. Specifically, the light emitting unit 42 is disposed on the unit island 4, and the connecting part 41 is connected to the four sides of the unit island 4, respectively. In one embodiment of the present disclosure, each connecting part 41 is disposed at a center position of the four sides of the unit island 4 as an example for description.

Preferably, in one embodiment of the present disclosure, when the connecting parts 41 are disposed, a starting end of each connecting part 41 is disposed at a center position of each side of the unit island 4. As such, the four connecting parts 41 respectively on the four sides of the unit island 4 may be distributed regularly corresponding to a geometric center of the unit island 4. The structure as shown in FIG. 4, two adjacent connecting parts 41 may be obtained by rotating a certain angle along the geometric center of the unit island 4.

Since each connecting part 41 is disposed at the center position of the four sides of the unit island 4, when the connecting part 41 is under a force, it may be ensured that each connecting part 41 bears the same force. Under the same action of force, the degree of rotation or deformation of each connecting part 41 may be ensured to be the same. Moreover, the unit island 4 may also rotate under the action of the connecting part 41. Since the force acting on each side is the same, therefore, the force on the unit island 4 is also uniform, and the stress generated between the unit island 4 and the connecting part 41 is also small, so that the display panel has good consistency.

Preferably, in one embodiment of the present disclosure, each connecting part 41 comprises at least three bending parts, that is, a first bending part 413, a second bending part 414, and a third bending part 415. In addition, each connecting part 41 also comprises at least one straight part 416, and a plurality of bending parts and straight parts constitute a complete connecting part in one embodiment of the present disclosure. Moreover, bending directions of the first bending part 413, the second bending part 414, and the third bending part 415 are different, thereby ensuring that the display panel is deformed at multiple angles and achieve good scalability performance.

Specifically, the first bending part 413 is a starting end of the connecting part 41. That is, one end of the first bending part 413 is connected to the side of the unit island 4, while the other end of the first bending part 413 is connected to one end of the second bending part 414, and the other end of the second bending part 414 is connected to one end of the straight part 416. The other end of the straight part 416 is connected to the third bending part 415. Thus, a complete connecting part 41 is constituted.

Further, the third bending part 415 corresponding to the connecting part 41 on each unit island 4 is connected to the third bending part 415 on the adjacent unit island 4, so that a plurality of unit islands 4 arranged in an array constitutes a whole.

Moreover, when the first bending part 413 is disposed, a bending radius corresponding to the first bending part 413 is R2. When the second bending part 414 is disposed, a bending radius corresponding to the second bending part 414 is R3. When the third bending part 415 is disposed, a bending radius corresponding to the third bending part 415 is R5. In order to ensure the scalability performance of the retractable flexible display panel, in one embodiment of the present disclosure, the bending radius R2 of the first bending part 413 is greater than the bending radius R3 of the second bending part 414. That is, the radius R2 of an arc corresponding to an inner edge of the first bending part 413 is greater than the radius R3 of an arc corresponding to an inner edge of the second bending part 414. That is, a curvature of the first bending part 413 is less than a curvature of the second bending part 414, where sizes of R3 and R4 may be the same.

Preferably, in one embodiment of the present disclosure, each bending radius R3=R4=20 μm, and a size of R2 may be arranged according to actual requirements.

Further, when the flexible display panel is stretched or compressed, the connecting part 41 is a structural member that is mainly deformed. Therefore, in one embodiment of the present disclosure, when each bending part is disposed, after connecting the bending part 413 to the side of the unit island 4, the bending directions of the inner edge and an outer edge of the first bending part 413 are bent toward an outside of the unit island 4. That is, it ensures that the end of the bending part of the first bending part 413 is gradually away from the side of corresponding unit island 4.

Specifically, as shown in FIG. 4, in order to make the unit island 4 and the connecting part 41 easier to bend after being stressed, and the adjacent connecting parts 41 do not interfere with each other. In one embodiment of the present disclosure, an angle ∠aO2b formed between a distance from a center of the circle O2 corresponding to an arc of the inner edge of the first bending part 413 to a foot of perpendicular a of the center of the circle O2 on the side corresponding to the first bending part 413 and a distance from the center O2 of the circle to a midpoint b of the arc is less than 90°, so that after the second bending part 414 is connected to the first bending part 413, the second bending part 414 is also far away from the side of corresponding unit island 4. Moreover, such arrangement also makes terminal ends of the inner edge of the first bending part 413 and the outer edge of the first bending part 413 are gradually away from the side of the unit island 4, so that the bending direction of the first bending part 413 is gradually away from the unit island 4. A direction of at least one of the openings on both sides of the first bending part 413 deviates from the side of the unit island 4. It ensures that each connecting part may not interfere with corresponding unit island 4 when each connecting part is deformed, thereby ensuring that the display panel has good scalability performance.

Further, in one embodiment of the present disclosure, the display panel may further comprise a transition part 4130. One end of the transition part 4130 is connected to corresponding side of the unit island 4, and the other end of the transition part 4130 is connected to one end of the first bending part 413. The first bending part 413 is easier to connect to the unit island 4 by providing the transition part 4130. Moreover, the distance between the first bending part 413 and the unit island 4 is increased by providing the transition part 4130. As such, when a force is applied to the display panel, the connecting part 41 is deformed, the connecting part 41 has more room for change, and the structural layout of the internal devices of the display panel is reasonable.

In one embodiment of the present disclosure, as providing each bending part, since the first bending part 413 is directly connected to the side of the unit island 4, when the first bending part 413 is disposed, a rounded corner R1 of a certain angle is provided at the connecting part corresponding to the first bending part 413 on the side, to prevent the side of the unit island 4 from fracturing when it is stretched or compressed. The size of the rounded corner R1 may be disposed according to actual requirements. In one embodiment of the present disclosure, the preferred radius of the rounded corner R1 is R1=15 μm.

Specifically, when the transition part 4130 is disposed, the rounded corner R1 is provided between the transition part 4130 and the unit island 4. After the rounded corner R1 is provided, the rest of the transition part 4130 may be an arc structure or a linear structure with a certain bending radius to facilitate connection with the first bending part 413.

Preferably, in one embodiment of the present disclosure, when the second bending part 414 and the straight part 416 are disposed, since the second bending part 414 is directly connected to the straight part 416, after connection, it is ensured that an extending direction of the straight part 416 is exactly the same as the first direction DR1 or the second direction DR2 of the display panel. Preferably, the straight parts 416 of the two adjacent connecting parts 41 may be perpendicular to each other on their respective extension lines, thereby effectively saving the layout space of the substrate and optimize the whole structure of the display panel.

Further, in one embodiment of the present disclosure, a straight part 416 is disposed, and both ends of the straight part 416 are respectively connected to the second bending part 414 and the third bending part 415. When the straight part 416 is disposed, a length of the straight part 416 may be disposed according to actual requirements.

When the display panel is stretched, the unit island 4 will rotate to a certain extent; meanwhile the connecting part connected to the unit island 4 will rotate and deform accordingly. When each connecting part is deformed under force, the bending part receives the most concentrated tensile or bending stress. Since the embodiment of the present disclosure is provided with the straight part 416, the straight part 416 increases the relative length of the connecting part, moreover, the straight portion 416 also makes the transition between the second bending part 414 and the third bending part 415 more natural. Therefore, each connecting part will deform to a greater extent under the action of a small tensile force, thereby avoiding a large recovery stress between the components, and effectively reducing the problem of stress concentration inside the display panel.

In one embodiment of the present disclosure, the connecting part 41 may comprise a first connecting part 411 and a second connecting part 412 disposed on two adjacent sides of the same unit island 4. Preferably, shapes of the first connecting part 411 and the second connecting part 412 may be the same, and a width W of the same connecting part may be the same. As such, the second connecting part 412 may be obtained when the first connecting part 411 rotates 90° counterclockwise around a geometric center of the unit island, thereby ensuring the uniformity of deformation of the retractable flexible panel.

Further, after the unit islands 4 arranged in an array are connected to corresponding connecting part 41, taking the first connecting part 411 as an example, the first connecting part 411 will form an interval Z will be formed with the second connecting part 412 and the unit island 4, respectively. Moreover, the straight part 416 of the first connecting part 411 will also form an interval Z with a first bending part 413 and a second bending part 414. In one embodiment of the present disclosure, in order to prevent the problem of mutual interference between various structural components, the interval Z between the second bending part 414 of the first connecting part 411 and the third bending part 415 of the second connecting part 412 is a minimum interval. When the value of the interval Z is the smallest, the straight part 416 may be close to each unit island 4 as possible. Meanwhile, it is ensured that the interval Z is not less than 20 μm, so as to achieve extreme processing accuracy and ensure that there is no mutual interference between each device. Moreover, a design space of the flexible display panel is also optimized. Preferably, in one embodiment of the present disclosure, the interval Z may be set to 20 μm. Moreover, the interval between the second bending part 414 of the first connecting part 411 and the third bending part 415 of the second connecting part 412 is the minimum interval value, so that each unit island 4 in the display panel and the connecting part connected to the unit island 4 occupy a small design space, and more light emitting display units can be arranged in the display panel, thereby effectively increasing the pixel density of the display panel and enhancing the resolution and display effect of the display panel.

In one embodiment of the present disclosure, a width of each side of the unit island 4 may be the same, and all are marked as a. Moreover, a certain width may be reserved at the side edge of the unit island 4, so that the connecting part 41 is connected to the unit island 4 in a good manner.

Further, in one embodiment of the present disclosure, the connecting parts 41 on opposite sides of the same unit island 4 may be disposed symmetrically corresponding to the geometric center of the unit island 4. Preferably, the connecting parts 41 on opposite sides of the same unit island 4 may be obtained by rotating a certain angle, the angle is between 0° and 180°, and the adjacent connecting parts 41 do not contact each other.

Figure 5:
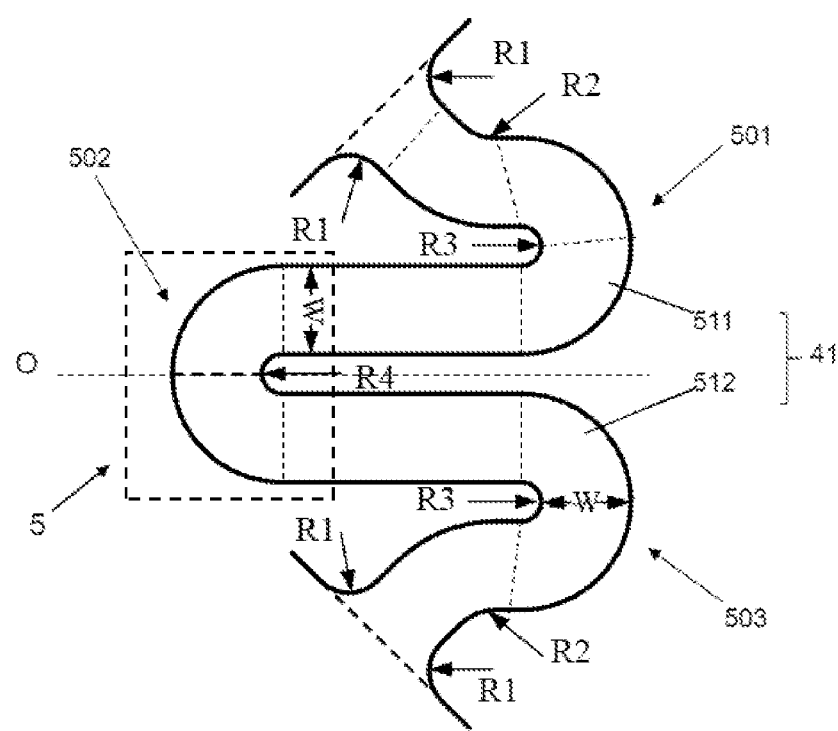
FIG. 5 is a schematic structural view of a corresponding connecting part in a common connecting area provided by one embodiment of the present disclosure.

As shown in FIG. 5, FIG. 5 is a schematic structural view of a corresponding connecting part in a common connecting area provided by one embodiment of the present disclosure. Two adjacent unit islands are connected by corresponding connecting parts. After the two connecting parts are connected, a whole and a common area 5 are formed, as shown in the structure in FIG. 5. The connecting part 41 further comprises a third connecting part 511 and a fourth connecting part 512. The third connecting part 511 and the fourth connecting part 512 are respectively connected to different unit islands, and then connected at the common area 5.

In one embodiment of the present disclosure, the connecting part 41 is axially symmetrical along a center line O. After connection, the two connecting parts form a whole. For the whole connecting part, it mainly comprises a first deformation zone 501, a second deformation zone 502, and a third deformation zone 503. The first deformation zone 501 is a second bending part on the third connecting part 511. The second deformation zone 502 are formed by the third bending part on the third connecting part 511 and the third bending part on the fourth connecting part 512. The third deformation zone 503 mainly corresponds to the second bending part on the fourth connecting part 512. Therefore, when the flexible panel is deformed, the main deformation parts also occur in the first deformation zone 501, the second deformation zone 502, and the third deformation zone 503.

In one embodiment of the present disclosure, since the bending angles of the first deformation zone 501, the second deformation zone 502, and the third deformation zone 503 are large, the connecting parts or bending parts corresponding to the first deformation zone 501, the second deformation zone 502, and the third deformation zone 503 may be disposed to be at least larger than a semicircular structure, as shown in a starting line and an ending line of an arc corresponding to each deformation zone in FIG. 5. Therefore, when a force is applied, the connecting part provided in one embodiment of the present disclosure is prone to deform, thereby ensuring that the flexible panel has good scalability performance.

When the third connecting part 511 and the fourth connecting part 512 are subjected to stress, such as tensile stress, in one embodiment of the present disclosure, since a plurality of bending parts are provided on the third connecting part 511 and the fourth connecting part 512, and the connecting part 41 corresponding to the first deformation zone 501, the second deformation zone 502, and the third deformation zone 503 is disposed to be at least larger than a semicircular structure, therefore, the transition between different deformation zones will be smooth. When the first deformation zone 501 and the third deformation zone 503 are deformed, deformation will occur when a small force is applied. Moreover, since the transition between the deformation zones is smooth and natural, the bending stress generated in the connecting part 41 is also small, and the stress concentration problem inside the display panel is also reduced.

Moreover, with reference to the structure in FIG. 4, an adapter part 4130 may also be provided in one embodiment of the present disclosure. The connection between the first bending part 413 and the unit island 4 is easier by providing the adapter part 4130. Moreover, the distance between the first bending part 413 and the unit island 4 is increase by providing the adapter part 4130. That is, the bending angles of the first deformation zone 501, the second deformation zone 502, and the third deformation zone 503 are large. As such, when a force is applied, the connecting part 41 has more room for deformation when the connecting part 41 is deformed, and the structural layout of the internal components of the display panel is more reasonable.

Moreover, in one embodiment of the present disclosure, after connection, the two straight parts on the third connecting part 511 and the fourth connecting part 512 may be parallel to each other, thereby effectively saving the layout space of the connecting part.

Figure 6:
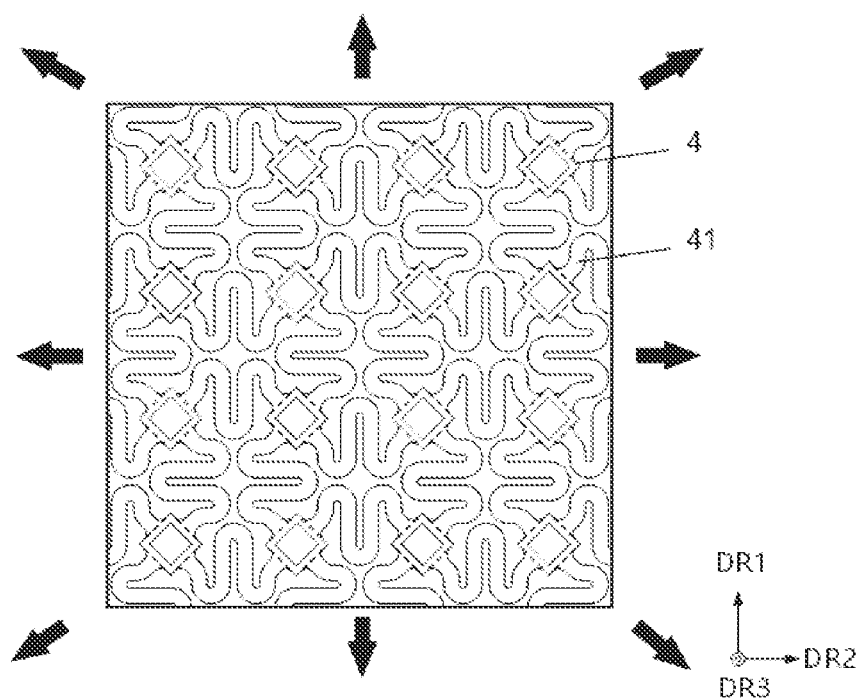
FIG. 6 is a schematic structural view of a structure of the retractable flexible panel before being stretched under a force provided by one embodiment of the present disclosure.

As shown in FIG. 6, FIG. 6 is a structure of the retractable flexible panel before being stretched under a force provided by one embodiment of the present disclosure. Before being stretched, the flexible panel is not affected by any force, therefore, the unit islands 4 arranged in an array on the substrate and the connecting parts 41 connected to the unit islands 4 are kept in a stable state without deformation. The flexible display panel may also display normally.

Figure 7:
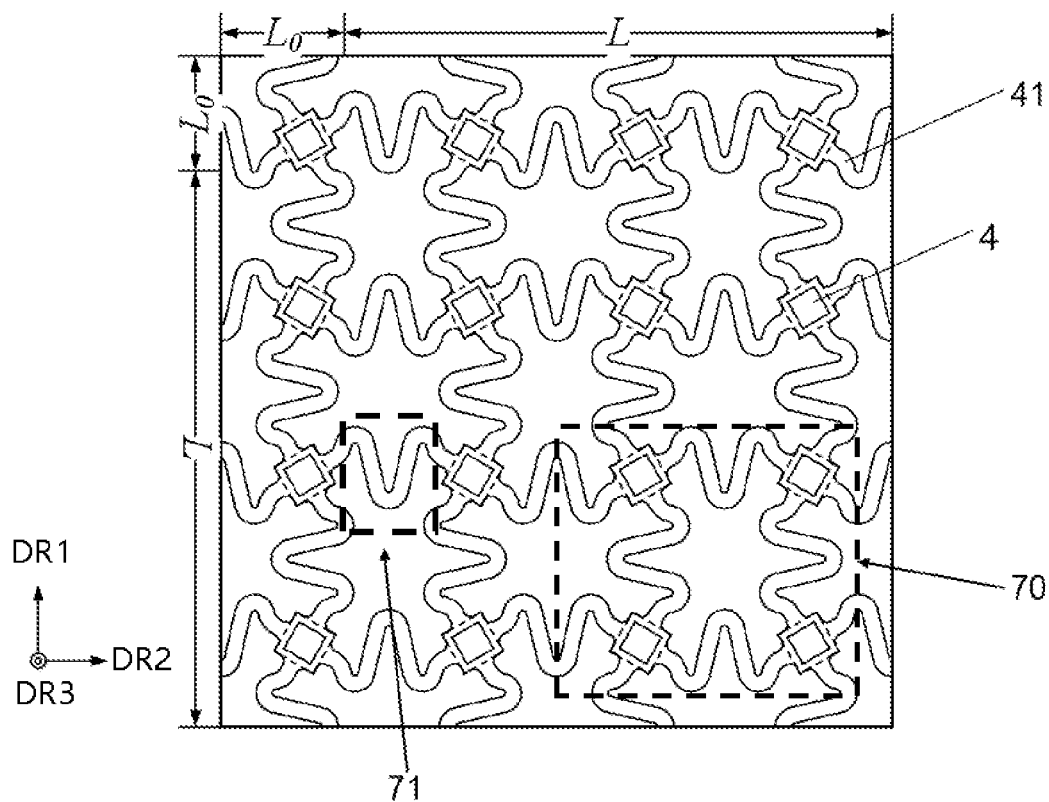
FIG. 7 is a schematic structural view of a structure of the retractable flexible panel before being deformed provided by one embodiment of the present disclosure.

As shown in FIG. 7, FIG. 7 is a schematic structural view of a structure of the retractable flexible panel before being deformed provided by one embodiment of the present disclosure. With reference to the force diagram in FIG. 6, when the flexible panel is subjected to an external force, the external force may be any direction around the flexible panel. The arrows in different directions as shown in FIG. 6 represent tensile forces in different directions. Before stretching, a side length of the flexible panel is L. As the tension increases, the side length of the flexible panel becomes L0. In one embodiment of the present disclosure, the force on the four sides of the flexible panel is the same and the force positions are mutually symmetrical. Therefore, after deformation, the four sides of the flexible panel increase by L0, and the length of the four sides of the flexible panel is L+L0.

Further, during the stretching process, the unit island 4 will rotate a certain angle under the pulling of the connecting part 41. Moreover, under the action of external force, the connecting part 41 will be stretched. Since the connecting part 41 is provided with a bending part, the bending part will deform to a certain extent, which will cause the connecting part 41 to deform, as shown in a deformed structure of the connecting part 41 in a common connecting area 71 in FIG. 7.

Moreover, since the two adjacent unit islands 4 are all connected by the connecting part 41, specifically, the two adjacent unit islands 4 may be connected to each other by the third bending part of corresponding connecting part 41.

Therefore, every four unit islands 4 form a deforming unit 70, and the connecting part 41 in the deforming unit 70 is deformed, so that a gap at a center of the deforming unit 70 becomes large and an area of the flexible panel becomes large.

In one embodiment of the present disclosure, since the connecting part 41 comprises a plurality of bending parts and straight parts, the bending parts are more easily deformed during deformation, and the deformation effect is good. A deformation angle and a range of each bending part are larger and may generate a certain deformation in different directions, thereby effectively enhancing the deformability performance of the retractable flexible panel. In one embodiment of the present disclosure, when the stretch is not less than 5%, the display panel may still emit light normally, and the reliability of the panel is high.

Figure 8:
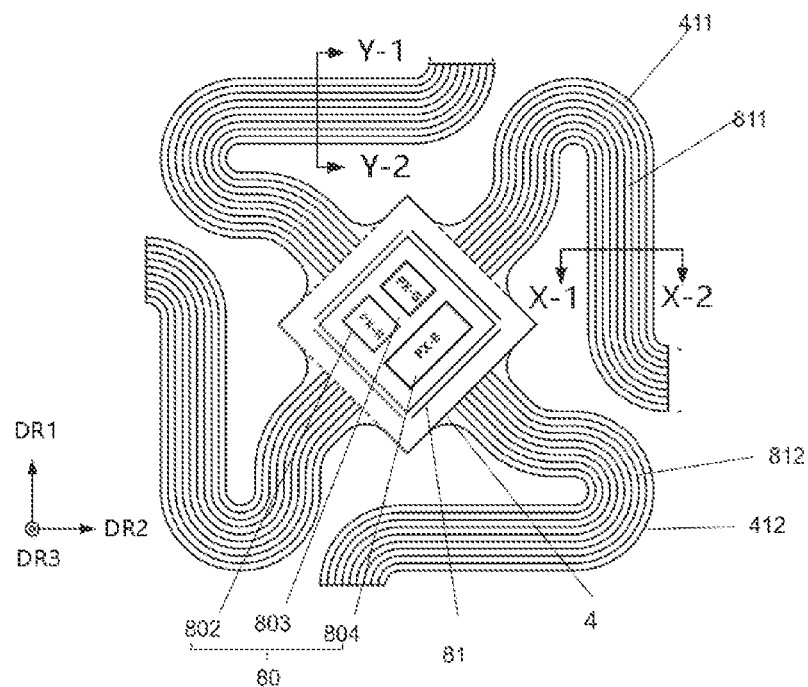
FIG. 8 is a schematic structural view of an arrangement of signal lines provided by one embodiment of the present disclosure.

As shown in FIG. 8, FIG. 8 is a schematic structural view of an arrangement of signal lines provided by one embodiment of the present disclosure. The light emitting unit 81 is provided on the unit island 4. Moreover, the light emitting unit 81 comprises a plurality of light emitting sub-pixels, and the sub-pixels comprise a red sub-pixel 802, a green sub-pixel 803, and a blue sub-pixel 804.

Specifically, when the sub-pixel structures are arranged, the red sub-pixel 802 and the green sub-pixel 803 may be arranged in the same direction, which may be parallel to the side of the unit island 4, and then the blue sub-pixel 804 may be arranged. The direction of the blue sub-pixel 804 is also parallel to the side direction of the unit island 4, and an area of the blue sub-pixel 804 is larger than an area of the red sub-pixel 802 and an area of the green sub-pixel 803. The specific structure is shown in the arrangement in FIG. 8, an arrangement shape of the blue sub-pixel 804, the red sub-pixel 802 and the green sub-pixel 803 is the same as an arrangement shape of each unit island 4. Specifically, in one embodiment of the present disclosure, taking the FIG. a in FIG. 9 as an example, the red sub-pixel, the blue sub-pixel, and the green sub-pixel are enclosed in a diamond shape, and a gap is disposed between two adjacent sub-pixels. A direction of a diagonal of the diamond shape of surrounded by the red sub-pixel, the blue sub-pixel, and the green sub-pixel is the same as a direction of a diagonal of the diamond shape formed by the unit islands. As such, the diamond shape structure is the same as or similar to the structure of diamond shape formed by the unit islands.

Figure 9:
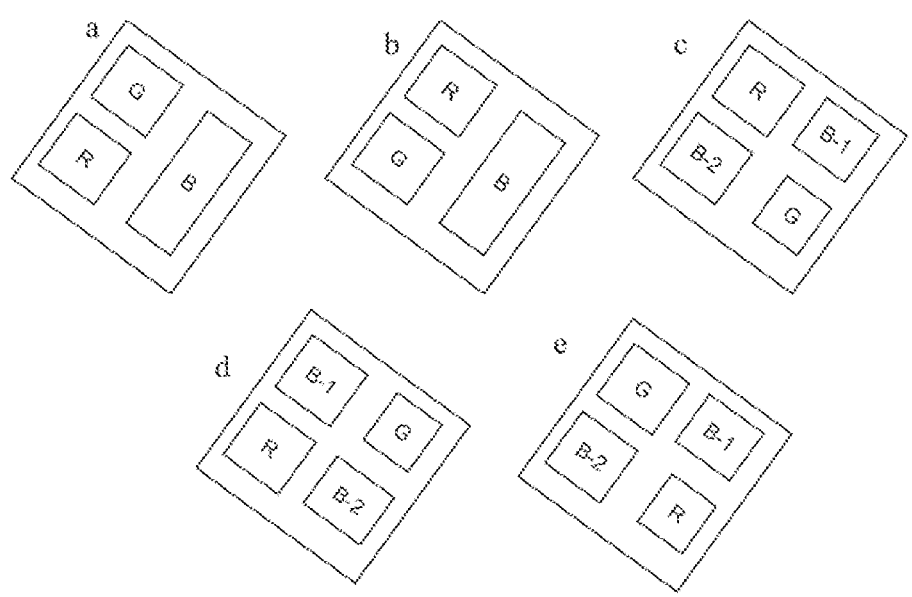
FIG. 9 is a schematic structural view of an arrangement of sub-pixels provided by one embodiment of the present disclosure.

Preferably, as shown in FIG. 9, FIG. 9 is a schematic structural view of an arrangement of sub-pixels provided by one embodiment of the present disclosure. Referring to FIG. a and FIG. b in FIG. 9, the structures of the red sub-pixel 802 and the green sub-pixel 803 may be arranged in a square structure, and the blue sub-pixel 804 may be arranged in a rectangular structure, but the present invention is not limited thereto. The structures of the red sub-pixel 802, the green sub-pixel 803, and the blue sub-pixel 804 shown in FIG. c, FIG. d, and FIG. may all be arranged in a square structure, and may be arranged alternately. The blue sub-pixels 804 may be arranged in a mirrored manner. The first blue sub-pixel B-1 and the second blue sub-pixel B-2 may emit blue light of different wavelengths, and the arrangement may have mirror symmetry.

In one embodiment of the present disclosure, the pixel density of the light emitting unit 81 is not less than 60PPI, and an elongation of the display panel in any direction is not less than 5%, the light emitting unit 81 may still emit light normally, and the brightness remains constant and the light emitting effect is good.

Further, a first signal line 811 is further disposed on the first connection part 411, and a second signal line 812 is further disposed on the second connection part 412. The wiring directions of the first signal line 811 and the second signal line 812 may be the same as the bending direction of the connecting part. Moreover, the signal lines in the same connecting part may be arranged at equal intervals, and a width of each signal line may be the same. Both the first signal line 811 and the second signal line 812 are electrically connected to the light emitting unit 81 to provide driving signals.

Preferably, the signal lines at a starting end of each connecting part may be arranged symmetrically along a midpoint of the side. Specifically, each signal line may comprises a signal transmission line, a gate transmission line, a voltage driving line, etc. The signal line in one embodiment of the present disclosure has a laminated structure to reduce the space occupied by the line.

Figure 10:
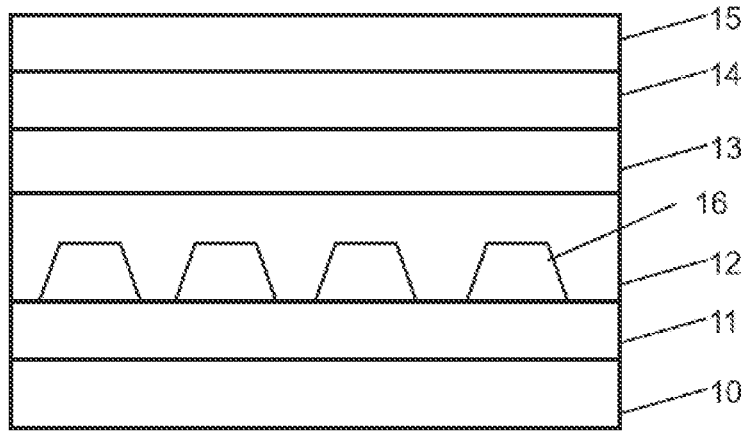
FIG. 10 is a schematic cross-sectional view of a connecting part and a signal line along the Y1-Y2 direction provided by one embodiment of the present disclosure.

As shown in FIG. 10, FIG. 10 is a schematic cross-sectional view of a connecting part and a signal line along the Y1-Y2 direction provided by one embodiment of the present disclosure. It comprises a substrate 10, a first encapsulation layer 11, a planarization layer 12, a second encapsulation layer 13, a support layer 14, and a third encapsulation layer 15 disposed in order from bottom to top.

First signal lines 16 are disposed in the planarization layer 12, and the planarization layer 12 completely covers the plurality of first signal lines 16. The first signal line 16 is fixed and packaged up and down through the first encapsulation layer 11 and the second encapsulation layer 13 to prevent the first signal line 16 from being displaced during the bending process and becoming inactive. Moreover, the first signal lines 16 may be disposed in parallel at equal intervals, and a width of each signal line may be the same.

Specifically, the material of the substrate 10 may be a polyimide material.

Figure 11:
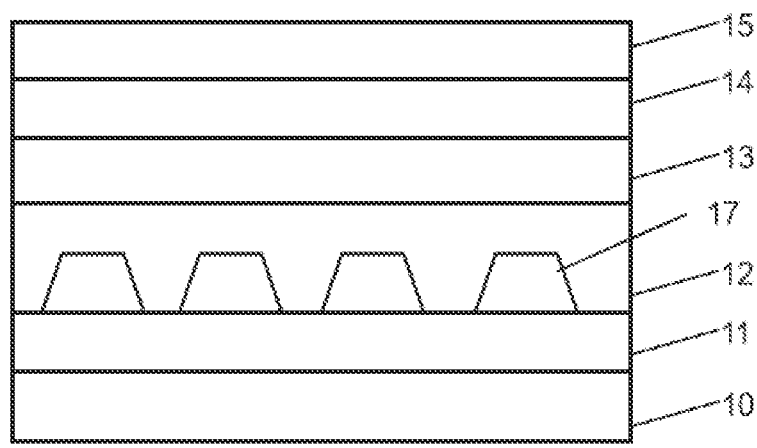
FIG. 11 is a schematic cross-sectional view of a connecting part and a signal line along the X1-X2 direction provided by one embodiment of the present disclosure.

As shown in FIG. 11, FIG. 11 is a schematic cross-sectional view of a connecting part and a signal line along the X1-X2 direction provided by one embodiment of the present disclosure. Specifically, it comprises a substrate 10, a first encapsulation layer 11, a planarization layer 12, a second encapsulation layer 13, a support layer 14, and a third encapsulation layer 15 disposed in order from bottom to top.

Second signal lines 17 are disposed in the planarization layer 12, and the planarization layer 12 completely covers a plurality of second signal lines 17.

One embodiment of the present disclosure also provides a display device. The display device comprises the display panel provided in the embodiments of the present disclosure. The display panel is a retractable flexible display panel. The display device may achieve a pixel density of not less than 70.5PPI. When the tensile elongation in any direction is not less than 5%, it may be continuously stretched and deformed in any direction in space. When it is stretched, the display may be achieved the deformation of the panel under the action of a small tensile stress, moreover, the stress distribution inside the display panel is more uniform, and the stress concentration problem is small. The driving voltage wiring layer of the pixel display body does not break and become inactive, and the display device has good scalability and high display quality.

The above describes in detail a display panel and a display device provided by the embodiments of the present disclosure. Specific examples are used herein to describe the principles and implementations of the present disclosure. The description of the above embodiments is only used to help understand the technical solutions and their concepts of the present disclosure. A person ordinarily skilled in the art should understand that they can still modify the technical solutions described in the foregoing embodiments, or equivalently replace some of the technical features. These modifications or replacements do not cause the essence of corresponding technical solutions to be departed from the scope of the technical solutions of the embodiments of the present disclosure.

What is claimed is:

1. A display panel, comprising:
    a substrate;
    a plurality of unit islands, wherein the unit islands are arranged in an array in a first direction and a second direction of the substrate, and each of the unit islands is separated from each other;
    a plurality of connecting parts, wherein the connecting parts connect two adjacent unit islands with each other;
    a light emitting unit, wherein the light emitting unit is disposed on the unit island, and the light emitting unit further comprises a plurality of light emitting sub-pixels; and
    a signal line, wherein the signal line is disposed on the connecting part and electrically connected to the light emitting unit;
    wherein each of the connecting parts is connected to each side of corresponding unit island, a starting end of the connecting part is disposed at a center position of the each side of the unit island, and each of the connecting parts comprises a bending part disposed in at least three bending directions and at least one straight part;
    wherein the display panel further comprises a hollow area between the unit island and the connecting part,
    wherein the bending part comprises a first bending part, a second bending part, and a third bending part, and wherein the first bending part is connected to the side of the unit island, the second bending part is connected to one end of the first bending part, one end of the straight part is connected to one end of the second bending part, and the other end of the straight part is connected to one end of the third bending part,
    wherein the connecting part comprises a first connecting part and a second connecting part, and the first connecting part and the second connecting part are respectively disposed on two adjacent sides of the unit island, and a distance between the third bending part of the first connecting part and the second bending part of the second connecting part is less than a distance between the straight part of the first connecting part and the first bending part or the second bending part of the first connecting part.

2. The display panel according to claim 1, wherein an angle between a distance from a center of the circle corresponding to an arc of an inner edge of the first bending part to a foot of perpendicular of the center of the circle on the side corresponding to the first bending part and a distance from the center of the circle to a midpoint of the arc is less than 90°.

3. The display panel according to claim 1, wherein a radius of an arc corresponding to an inner edge of the first bending part is greater than a radius of an arc corresponding to an inner edge of the second bending part.

4. The display panel according to claim 1, wherein the two adjacent unit islands are connected to each other by the third bending part.

5. The display panel according to claim 1, wherein the connecting part further comprises a transition part, one end of the transition part is connected to the side of the unit island, the other end of the transition part is connected to one end of the first bending part, and one end of the transition part and the side of the unit island are provided with rounded corners.

6. The display panel according to claim 1, wherein the connecting parts on the two opposite sides of the unit island are disposed symmetrically corresponding to a geometric center of the unit island.

7. A display panel, comprising:
    a substrate;
    a plurality of unit islands, wherein the unit islands are arranged in an array in a first direction and a second direction of the substrate, and each of the unit islands is separated from each other;
    a plurality of connecting parts, wherein the connecting parts connect the two adjacent unit islands with each other;
    a light emitting unit, wherein the light emitting unit is disposed on the unit island; and
    a signal line, wherein the signal line is disposed on the connecting part and electrically connected to the light emitting unit;
    wherein each of the connecting parts is connected to each side of corresponding unit island, a starting end of the connecting part is disposed at a center position of the each side of the unit island, and each of the connecting parts comprises a bending part disposed in at least three bending directions and at least one straight part,
    wherein the bending part comprises a first bending part, a second bending part, and a third bending part, and wherein the first bending part is connected to the side of the unit island, the second bending part is connected to one end of the first bending part, one end of the straight part is connected to one end of the second bending part, and the other end of the straight part is connected to one end of the third bending part,
    wherein the connecting part comprises a first connecting part and a second connecting part, and the first connecting part and the second connecting part are respectively disposed on two adjacent sides of the unit island, and a distance between the third bending part of the first connecting part and the second bending part of the second connecting part is less than a distance between the straight part of the first connecting part and the first bending part or the second bending part of the first connecting part.

8. The display panel according to claim 7, wherein an angle formed between a distance from a center of the circle corresponding to an arc of an inner edge of the first bending part to a foot of perpendicular of the center of the circle on the side corresponding to the first bending part and a distance from the center of the circle to a midpoint of the arc is less than 90°.

9. The display panel according to claim 7, wherein a radius of an arc corresponding to an inner edge of the first bending part is greater than a radius of an arc corresponding to an inner edge of the second bending part.

10. The display panel according to claim 7, wherein the two adjacent unit islands are connected to each other by the third bending part.

11. The display panel according to claim 7, wherein the display panel further comprises a hollow area between the unit island and the connecting part, and the hollow area is filled with an elastic organic layer.

12. The display panel according to claim 7, wherein the connecting part further comprises a transition part, one end of the transition part is connected to the side of the unit island, the other end of the transition part is connected to one end of the first bending part, and one end of the transition part and the side of the unit island are provided with rounded corners.

13. The display panel according to claim 7, wherein the connecting parts on the two opposite sides of the unit island are disposed symmetrically corresponding to a geometric center of the unit island.

14. The display device according to claim 7, wherein a width of the bending part of the connecting part is the same as a width of the straight part of the connecting part.

15. The display device according to claim 7, wherein the light emitting unit comprises a plurality of light emitting sub-pixels, the light emitting sub-pixels comprises a red sub-pixel, a blue sub-pixel, and a green sub-pixel, and wherein an area of a light emitting region corresponding to the blue sub-pixel is larger than an area of a light emitting region corresponding to the red sub-pixel, the area of the light emitting region corresponding to the blue sub-pixel is larger than an area of a light emitting region corresponding to the green sub-pixel, and an arrangement shape of a structure of diamond shape formed by the blue sub-pixel, the red sub-pixel, and the green sub-pixel is the same as an arrangement shape of a structure of diamond shape formed by each of the unit islands.

* * * * *